United States Patent
Sun et al.

(10) Patent No.: US 10,490,745 B2
(45) Date of Patent: Nov. 26, 2019

(54) VERTICAL AND PLANAR RRAM WITH TIP ELECTRODES AND METHODS FOR PRODUCING THE SAME

(71) Applicant: GLOBALFOUNDRIES Singapore Pte. Ltd., Singapore (SG)

(72) Inventors: Jianxun Sun, Singapore (SG); Juan Boon Tan, Singapore (SG); Kwang Sing Yew, Singapore (SG); Wanbing Yi, Singapore (SG); Curtis Chun-I Hsieh, Singapore (SG); Tupei Chen, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/921,293

(22) Filed: Mar. 14, 2018

(65) Prior Publication Data
US 2019/0288201 A1    Sep. 19, 2019

(51) Int. Cl.
*H01L 45/00* (2006.01)
*H01L 27/24* (2006.01)

(52) U.S. Cl.
CPC ...... *H01L 45/1273* (2013.01); *H01L 27/2481* (2013.01); *H01L 45/08* (2013.01);
(Continued)

(58) Field of Classification Search
CPC . H01L 27/2463; H01L 27/2481; H01L 45/08; H01L 45/1226; H01L 45/1233;
(Continued)

(56) References Cited

U.S. PATENT DOCUMENTS

| | | | | |
|---|---|---|---|---|
| 5,469,015 A | * | 11/1995 | Kaneko | H01J 3/022 |
| | | | | 313/308 |
| 8,547,004 B2 | * | 10/2013 | Eden | H01T 21/00 |
| | | | | 313/267 |

(Continued)

OTHER PUBLICATIONS

Niu et al., "Geometric conductive filament confinement by nanotips for resistive switching of HfO2-RRAM devices with high performance" Published in Scientific Reports, May 16, 2016. 6: p. 25757, retrieved on Aug. 24, 2017, from "https://www.ncbi.nlm.nih.gov/pmc/articles/PMC4867633/", pp. 1-9.

(Continued)

*Primary Examiner* — Stephen W Smoot
(74) *Attorney, Agent, or Firm* — Ditthavong & Steiner P.C.

(57) ABSTRACT

Methods of forming planar RRAM and vertical RRAM with tip electrodes and the resulting devices are provided. Embodiments include forming a first metal oxide layer on a first dielectric layer; forming and patterning a mask layer over the first metal oxide layer; etching the first metal oxide through the mask layer to form openings for a first and second metal electrodes; removing the mask layer; forming the first and second metal electrodes in the openings; and forming a second metal oxide layer over the first and second metal electrodes, wherein the first and second metal electrodes are v-shaped in top view with tips of the first and second metal electrodes facing each other and a portion of the second metal oxide layer being formed between the tips of the first and second electrodes.

20 Claims, 11 Drawing Sheets

(52) U.S. Cl.
CPC ........ *H01L 45/1266* (2013.01); *H01L 45/146* (2013.01); *H01L 45/1226* (2013.01); *H01L 45/1233* (2013.01); *H01L 45/1675* (2013.01); *H01L 45/1683* (2013.01)

(58) Field of Classification Search
CPC ............. H01L 45/1266; H01L 45/1273; H01L 45/146; H01L 45/1675; H01L 45/1673; G11C 13/0007
See application file for complete search history.

(56) References Cited

U.S. PATENT DOCUMENTS

| | | | | |
|---|---|---|---|---|
| 2006/0097238 | A1* | 5/2006 | Breuil | G11C 13/0011 257/4 |
| 2008/0247226 | A1* | 10/2008 | Liu | H01L 45/04 365/163 |
| 2009/0114899 | A1* | 5/2009 | Lee | H01L 27/101 257/4 |
| 2016/0118580 | A1* | 4/2016 | Lin | H01L 45/06 438/382 |
| 2016/0315256 | A1* | 10/2016 | Ge | H01L 45/08 |

OTHER PUBLICATIONS

Sun et al., "Direct Observation of Conversion Between Threshold Switching and Memory Switching Induced by Conductive Filament Morphology", Published in Advanced Functional Materials, Jul. 14, 2014. 24(36), retrieved on Aug. 24, 2017, from "http://onlinelibrary.wiley.com/doi/10.1002/adfm.201401304/full", pp. 1-8.

\* cited by examiner

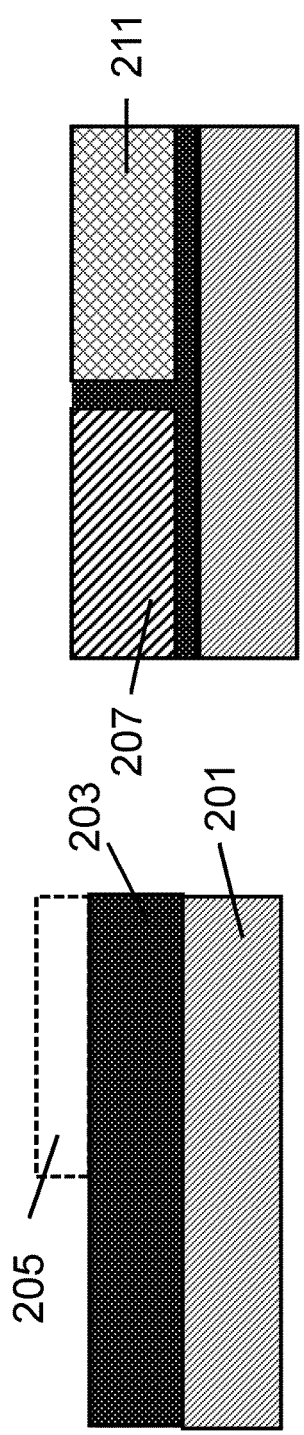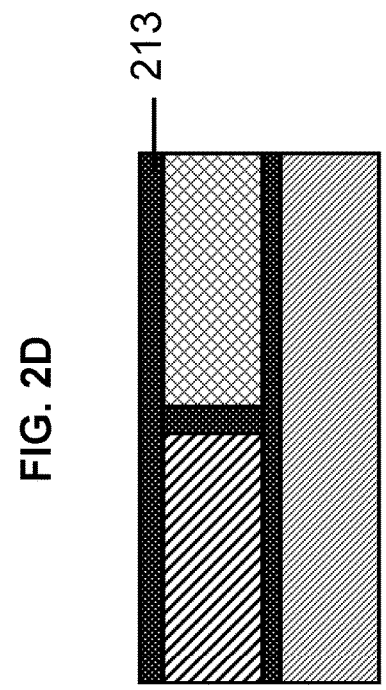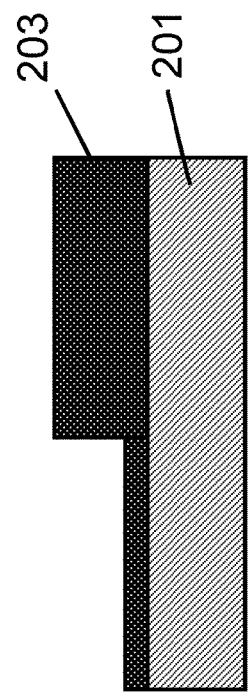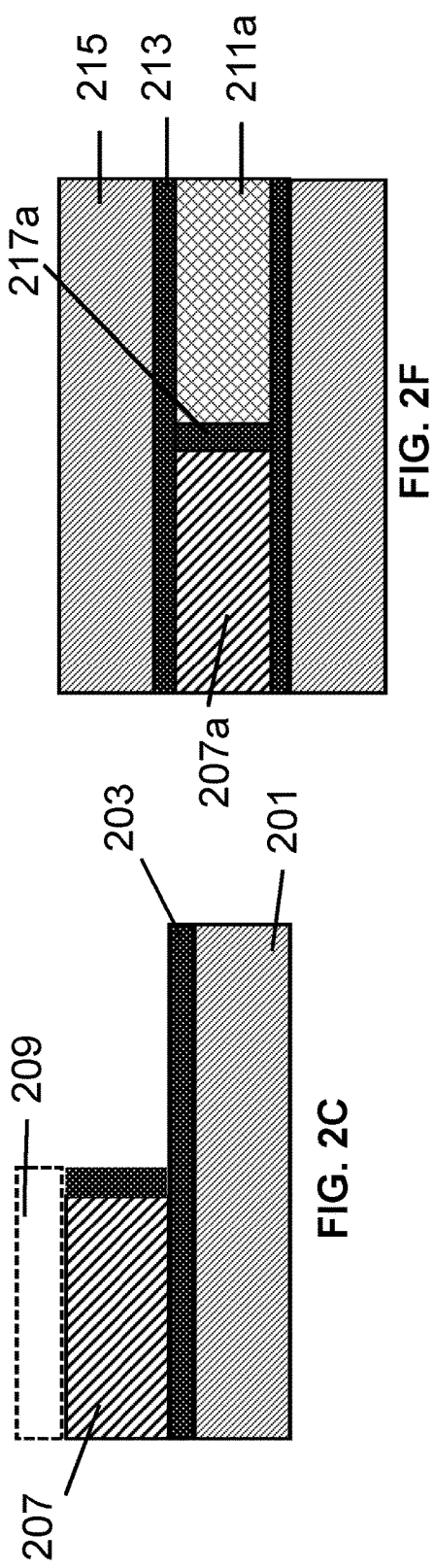

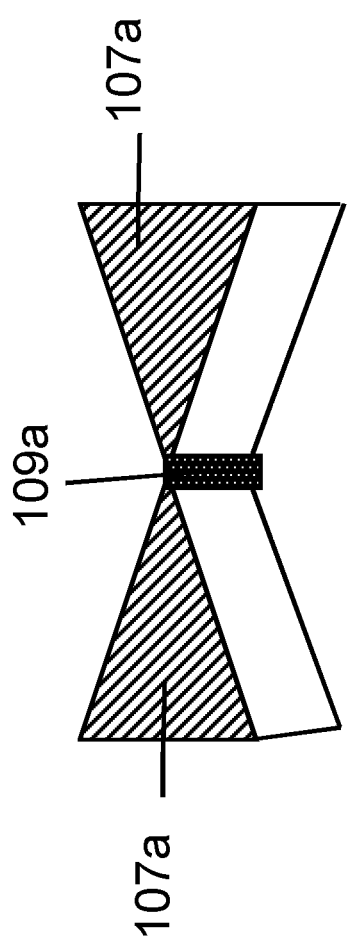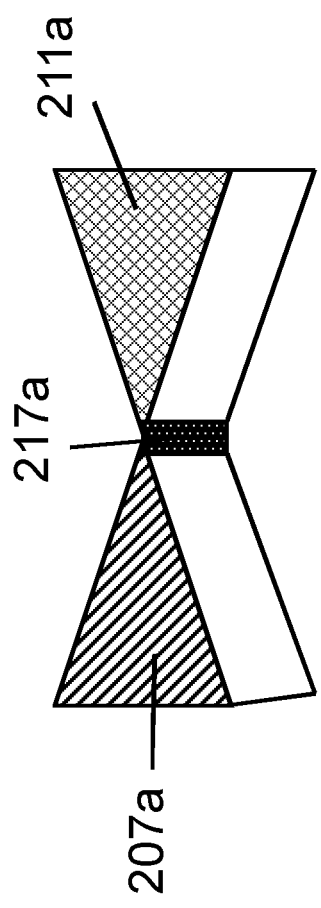

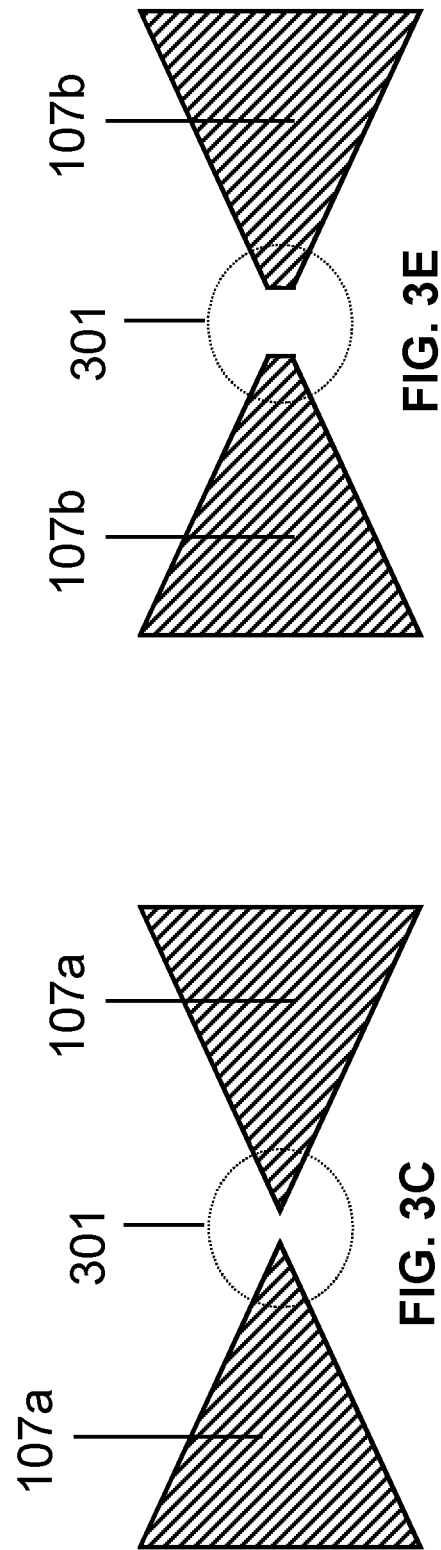

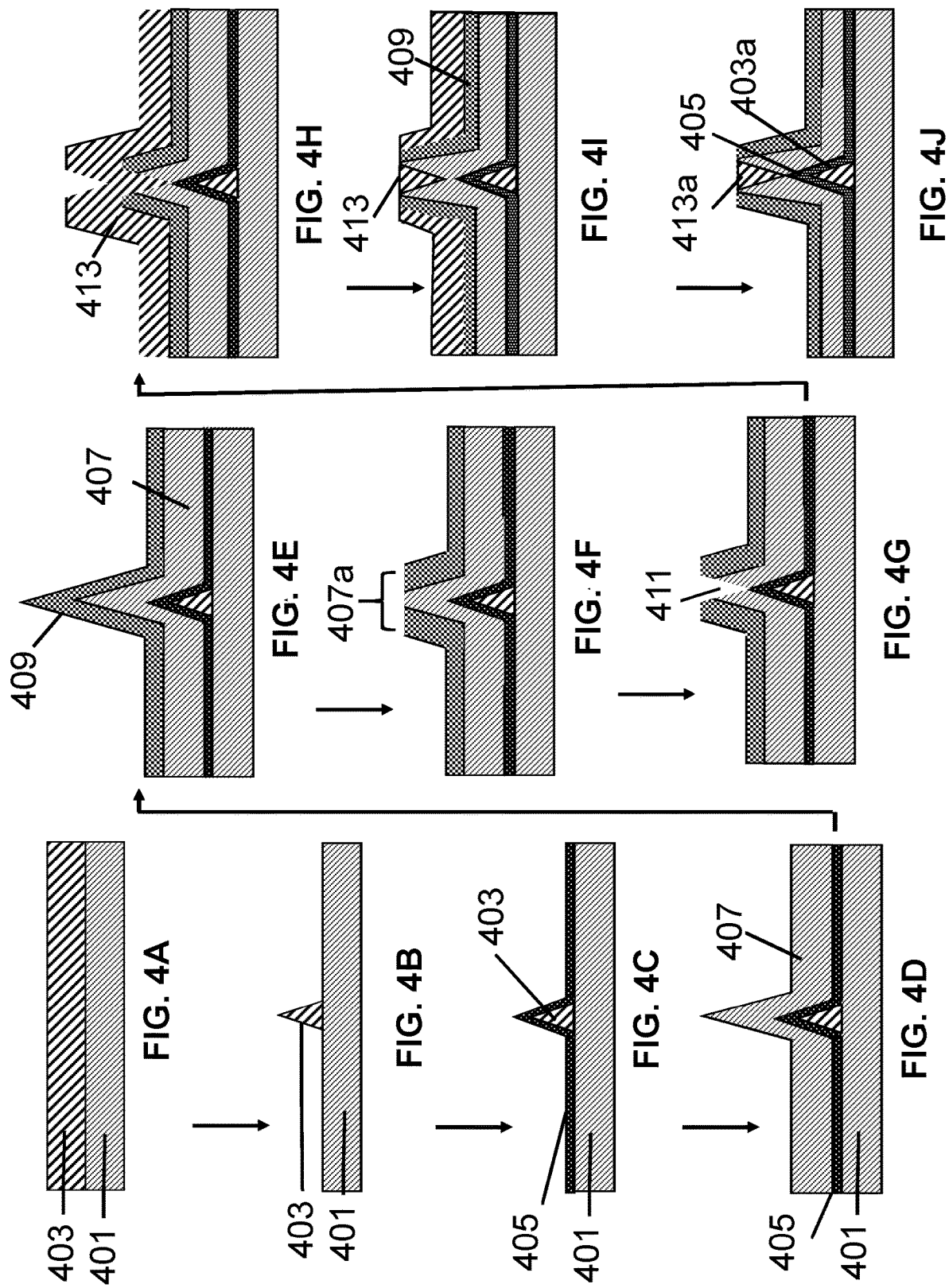

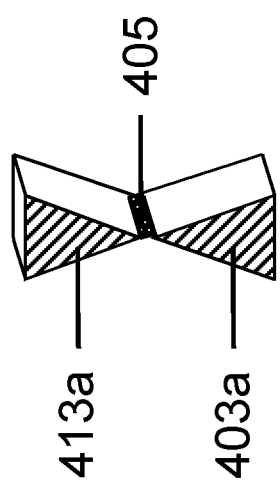
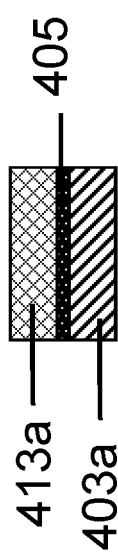

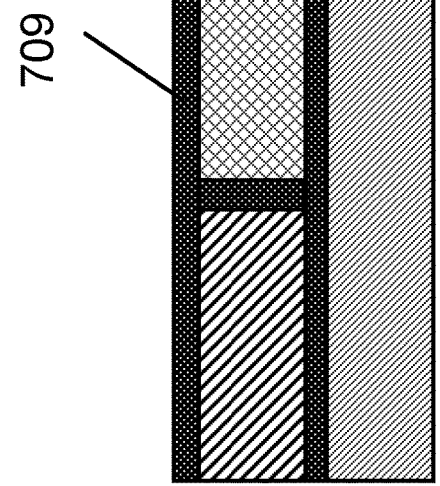
FIG. 7A
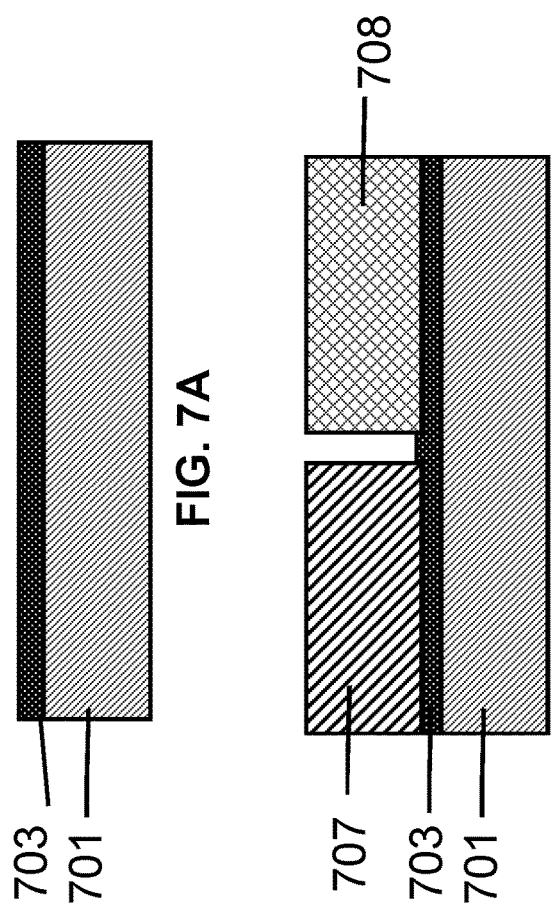
FIG. 7B
FIG. 7C
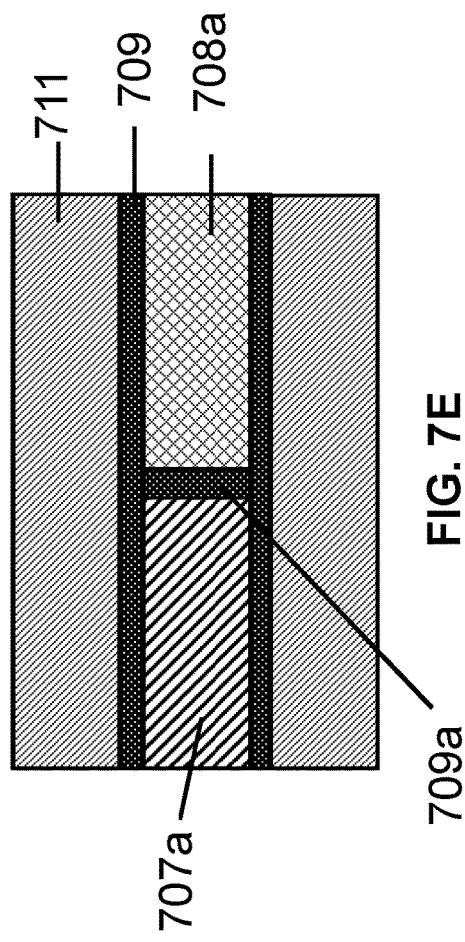
FIG. 7D
FIG. 7E
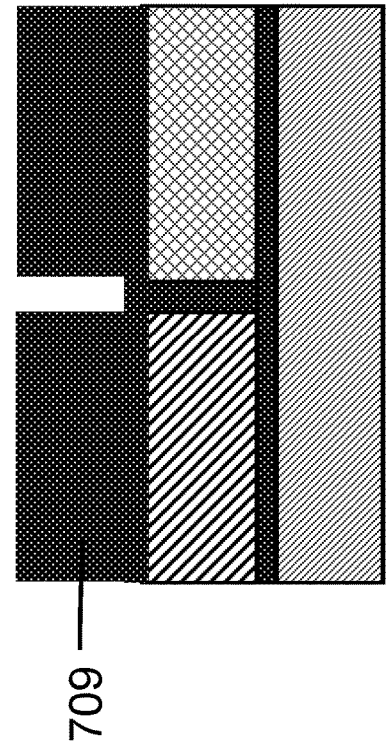

VERTICAL AND PLANAR RRAM WITH TIP ELECTRODES AND METHODS FOR PRODUCING THE SAME

TECHNICAL FIELD

The present disclosure generally relates to semiconductor devices. The present disclosure is particularly applicable resistive random access memory (RRAM) devices.

BACKGROUND

A planar RRAM cell structure is a known memory switching device. The planar structure is used to observe conversion between threshold switching and memory switching directly. A single tip electrode with a vertical RRAM cell structure is also available. The single tip bottom electrode is fabricated by reactive ion etching (RIE) to confine the filament and improve device endurance.

The uncontrolled oxygen vacancies exist with a conventional vertical RRAM cell structure. The uncontrolled oxygen vacancies lead to device instability of the vertical structured metal oxide based RRAM.

A need therefore exists for methodology enabling formation of planar or vertical RRAM tip electrodes with improved device reliability and the resulting device.

SUMMARY

An aspect of the present disclosure is to improve the device reliability such as endurance and retention of the metal-oxide based RRAM by using tip electrodes with a planar or vertical structure.

Another aspect of the present disclosure is to improve the device reliability such as endurance and retention of the metal-oxide based RRAM by using self-aligned tip electrodes with a vertical structure.

Another aspect of the present disclosure is to improve the device reliability such as endurance and retention of the metal-oxide based RRAM by using symmetric or asymmetric tip electrodes for a planar structure.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first metal oxide layer on a first dielectric layer; forming and patterning a mask layer over the first metal oxide layer; etching the first metal oxide through the mask layer to form openings for a first and second metal electrodes; removing the mask layer; forming the first and second metal electrodes in the openings; and forming a second metal oxide layer over the first and second metal electrodes, wherein the first and second metal electrodes are v-shaped in top view with tips of the first and second metal electrodes facing each other and a portion of the second metal oxide layer being formed between the tips of the first and second electrodes.

Aspects of the present disclosure include forming a second dielectric layer over the second metal oxide layer by chemical vapor deposition (CVD). Other aspects include forming a RRAM cell, and a plurality of RRAM cells are stacked over a logic circuit. Another aspect includes the first and second metal oxide layers including hafnium oxide ($HfO_2$), titanium oxide ($TiO_2$), aluminum oxide ($Al_2O_3$), or tantalum pentoxide ($Ta_2O_5$). Further aspects include forming the first and second metal electrodes by sputter deposition, wherein the first and second metal electrodes are coplanar and include titanium (Ti), titanium nitride (TiN), tantalum (Ta) or tantalum nitride (TaN), aluminum (Al), copper (Cu), or aluminum copper silicon (AlCuSi). Another aspect includes planarizing the first and second metal electrodes by chemical mechanical polishing (CMP) prior to forming the second metal oxide layer. Yet another aspect includes wet or dry etching the first metal oxide through the mask layer to form the openings for the first and second metal electrodes. The first and second tip electrodes can be symmetric or asymmetric.

Another aspect of the present disclosure is a device including: a first metal oxide layer formed on a first dielectric layer; first and second metal electrodes formed over the first metal oxide layer; second metal oxide layer formed over the first and second metal electrodes; a second dielectric layer formed over the second metal oxide layer, wherein the first and second metal electrodes are v-shaped in top view, with tips of the first and second metal electrodes facing each other and a portion of the second metal oxide layer being formed between the tips of the first and second electrodes.

Aspects of the present disclosure include wherein the first and second metal electrodes being coplanar and including Ti, TiN, Ta, TaN, Al, Cu, or AlCuSi. Other aspects include the first metal electrode including Ti or TiN, the second metal electrode including Ta or TaN, and the first and second metal electrodes being coplanar. Another aspect includes the first and second metal oxide layers including $HfO_2$, $TiO_2$, $Al_2O_3$, or $Ta_2O_5$. Further aspects include the first and second dielectric layers including silicon dioxide ($SiO_2$), carbon-doped silicon oxide (SiCOH), or silicon nitride (SiN).

A further aspect of the present disclosure is a method including: forming a first metal oxide layer on a first dielectric layer; forming and patterning a first mask layer over the first metal oxide layer; etching the first metal oxide through the first mask layer to form a first opening for a first metal electrode; forming the first metal electrode in the first opening; forming and patterning a second mask layer over the first metal oxide layer; etching the first metal oxide through the second mask layer to form a second opening for a second metal electrode; forming the second metal electrode in the second opening; forming a second metal oxide layer over the first and second metal electrodes, wherein the first and second metal electrodes include different metals and are v-shaped in top view, with tips of the first and second metal electrodes facing each other and a portion of the second metal oxide layer being formed between the tips of the first and second electrodes.

Aspects of the present disclosure include the first metal electrode including Ti or TiN, the second metal electrode including Ta or TaN, and the first and second metal electrodes being coplanar. Other aspects include the first and second metal oxide layers including $HfO_2$, $TiO_2$, $Al_2O_3$, or $Ta_2O_5$.

According to the present disclosure, some technical effects may be achieved in part by a method including forming a first metal layer on a first dielectric layer; etching the first metal layer to form a first metal electrode having a v-shape in cross-sectional view; forming a metal oxide layer over the dielectric layer and first metal electrode; forming a second dielectric layer over the metal oxide layer; forming and patterning a nitride layer over the second dielectric layer to expose an upper portion of the second dielectric layer;

forming a v-shaped groove in the second dielectric layer; and forming a second metal electrode in the v-shaped groove, wherein tips of the v-shaped first and second metal electrodes face each other in cross-sectional view, and a portion of the metal oxide layer is formed between the tips of the first and second electrodes.

Aspects include forming the first and second metal electrodes as a RRAM cell, and a plurality of RRAM cells are stacked over a logic circuit. Other aspects include the first and second metal electrodes being vertically stacked and include Ti or titanium TiN. Other aspects include the tips of the first and second v-shape electrodes being self-aligned.

Yet a further aspect of the present disclosure is a device including: a first metal electrode having a v-shape in cross-sectional view formed over a first dielectric layer; a metal oxide layer formed over the dielectric layer and first metal electrode; a second dielectric layer formed over the metal oxide layer; a nitride layer formed over the second dielectric layer; and a second metal electrode having a v-shape formed in the second dielectric layer, wherein tips of the v-shaped first and second metal electrodes face each other in cross-sectional view, and a portion of the metal oxide layer is formed between the tips of the first and second electrodes.

Aspects include the first and second metal electrodes being vertically stacked and including Ti, TiN, Ta, TaN, Al, Cu, or AlCuSi.

Yet a further aspect of the present disclosure is a method forming a planar RRAM cell with tip electrodes by forming a first metal oxide over a dielectric and performing lithography for electrode patterning. A metal or metal compound is deposited over the first metal oxide and a lift-off process is performed to produce v-shaped planar tip electrodes. A second metal oxide is formed over the metal tip electrodes and a dielectric layer is formed over the second metal oxide. The metal tip electrodes can be symmetric or asymmetric in terms of the metal or metal compound used in forming the metal tip electrodes.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A-2F schematically illustrate, in cross-sectional view, a process flow to produce a planar RRAM with asymmetric tip electrodes, in accordance with another exemplary embodiment;

FIGS. 3A-3B schematically illustrate, in three-dimensional top view, symmetric electrodes and asymmetric electrodes, respectively, in accordance with exemplary embodiments;

FIGS. 3C-3E schematically illustrate, in top view, symmetric electrodes having different shaped tips, in accordance with exemplary embodiments;

FIGS. 4A-4J schematically illustrate, in cross-sectional view, a process flow to produce a vertical RRAM with self-aligned tip electrodes, in accordance with another exemplary embodiment;

FIG. 5A schematically illustrates, in three-dimensional top view, vertical RRAM self-aligned tip electrodes, in accordance with an exemplary embodiment;

FIG. 5B schematically illustrates, in cross-sectional view, vertical RRAM self-aligned tip electrodes, in accordance with an exemplary embodiment;

FIGS. 7A-7E schematically illustrate, in cross-sectional view, an etchless process flow to produce a planar RRAM with asymmetric tip electrodes, in accordance with an exemplary embodiment;

DETAILED DESCRIPTION

Figure 1A:
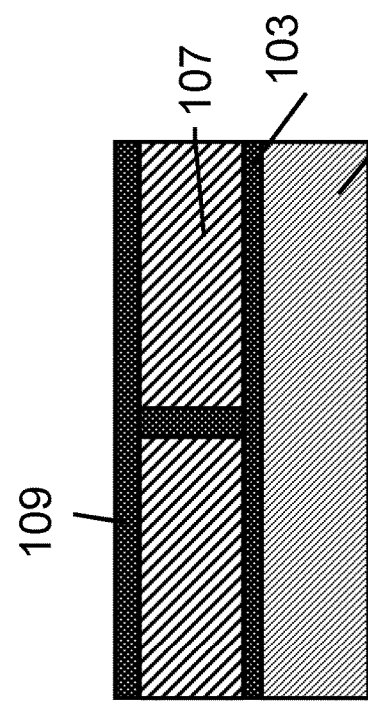
FIGS. 1A-1E schematically illustrate, in cross-sectional view, a process flow to produce a planar RRAM with symmetric tip electrodes, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of uncontrolled oxygen vacancies distribution which leads to device instability in metal oxide based RRAM. The problem is solved, inter alia, by tip electrodes with planar structure or self-aligned tip electrodes with vertical structure.

Methodology in accordance with embodiments of the present disclosure includes forming a first metal oxide layer on a first dielectric layer; forming and patterning a mask layer over the first metal oxide layer; etching the first metal oxide through the mask layer to form openings for a first and second metal electrodes; removing the mask layer; forming the first and second metal electrodes in the openings; and forming a second metal oxide layer over the first and second metal electrodes, wherein the first and second metal electrodes are v-shaped in top view with tips of the first and second metal electrodes facing each other and a portion of the second metal oxide layer being formed between the tips of the first and second electrodes. Other methodology in accordance with embodiments of the present disclosure includes forming a first metal layer on a first dielectric layer;

etching the first metal layer to form a first metal electrode having a v-shape in cross-sectional view; forming a metal oxide layer over the dielectric layer and first metal electrode; forming a second dielectric layer over the metal oxide layer; forming and patterning a nitride layer over the second dielectric layer to expose an upper portion of the second dielectric layer; forming a v-shaped groove in the second dielectric layer; and forming a second metal electrode in the v-shaped groove, wherein tips of the v-shaped first and second metal electrodes face each other in cross-sectional view, and a portion of the metal oxide layer is formed between the tips of the first and second electrodes.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1B:
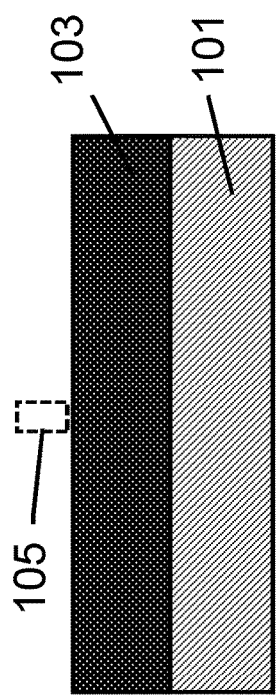

FIGS. 1A-1E schematically illustrate, in cross-sectional view, a process flow to produce a planar RRAM with symmetric tip electrodes, in accordance with an exemplary embodiment. In FIG. 1A, a first dielectric layer 101 is formed over a substrate (not shown for illustrative convenience). The first dielectric layer 101 can comprise $SiO_2$, SiCOH, SiN, and other known dielectrics used in complimentary metal oxide semiconductor (CMOS) processing. The thickness of the first dielectric layer 101 can be from 80 to 120 nm. A first metal oxide 103 is deposited on the first dielectric layer 101 by a deposition process such as atomic layer deposition (ALD). The first metal oxide 103 can include $HfO_2$, $TiO_2$, $Al_2O_3$, $Ta_2O_5$, and other transition metal oxides. The first metal oxide 103 is deposited over the first dielectric at a thickness of 50 to 150 nanometers (nm). A lithography process for a two electrode patterning is performed. A photoresist 105 is applied and patterned over the first metal oxide layer 103 and an etching step is performed to etch down 60 to 100 nm of the first metal oxide 103, followed by stripping of the photoresist 105, as shown in FIG. 1B. A wet etching step can be used to remove the first metal oxide layer 103.

Figure 1D:
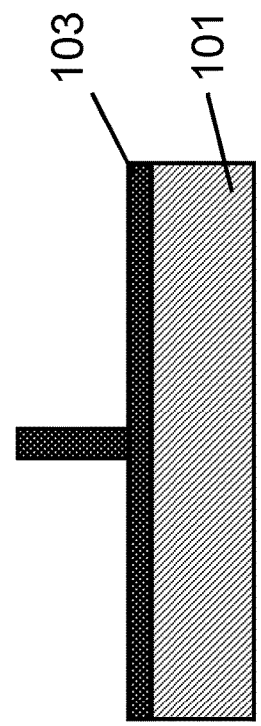
Figure 1C:
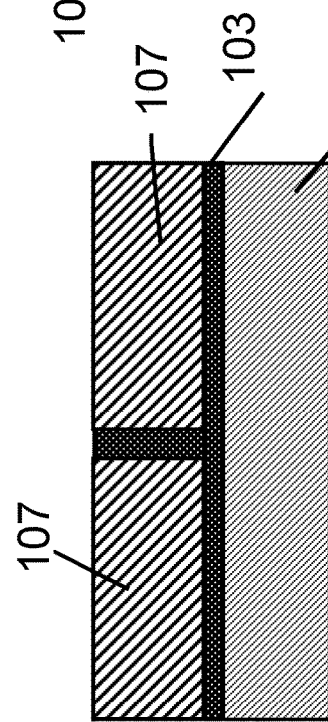

In FIG. 1C, a deposition process is performed of deposit a metal or metal compound 107 over the etched metal oxide layer 103. A sputter deposition process can be used to deposit the metal or metal compound 107. The metal or metal compound 107 is deposited to a thickness of 60 to 100 nm. The metal or metal compound 107 can be selected from Ti, TiN, Ta, TaN, Al, Cu, AlCuSi, and other metals or metal compounds used in CMOS processing. A CMP process is performed over the deposited metal or metal compound 107 to remove excess metal or metal compound 107.

Figure 1E:
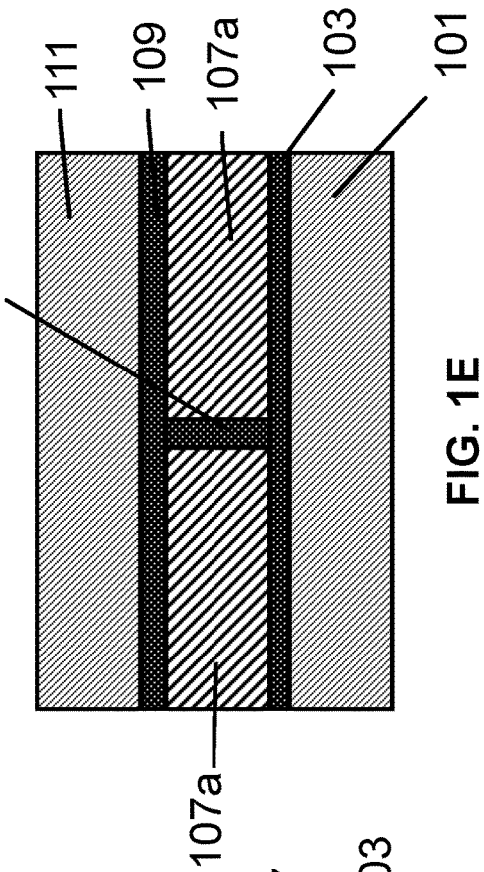

In FIG. 1D, a deposition of a second metal oxide layer 109 is performed. An ALD process can be used to deposit the second metal oxide 109 to a thickness of 10 to 30 nm. The second metal oxide 109 can include $HfO_2$, $TiO_2$, $Al_2O_3$, $Ta_2O_5$, and other transition metal oxides. In FIG. 1E, a second dielectric layer 111 is deposited over the second metal oxide layer 109. In FIG. 1E, a cross-sectional view of the planar RRAM cell with symmetric metal tip electrodes 107a is shown. The metal tip electrodes 107a in this example are formed of the same metal or metal compound 107 and therefore are symmetric. A portion of the metal oxide 109a is formed between the metal tip electrodes 107a.

FIGS. 2A-2F schematically illustrate, in cross-sectional view, a process flow to produce a planar RRAM with asymmetric tip electrodes, in accordance with another exemplary embodiment. In FIG. 2A, a first dielectric layer 201 is formed over a substrate (not shown for illustrative convenience). The first dielectric layer 201 can comprise $SiO_2$, SiCOH, SiN, and other dielectrics used in CMOS processing. The thickness of the first dielectric layer 201 can be from 80 to 120 nm. A first metal oxide 203 is deposited on the first dielectric layer 201 by a deposition process such as atomic layer deposition (ALD). The first metal oxide 203 can include $HfO_2$, $TiO_2$, $Al_2O_3$, $Ta_2O_5$, and other transition metal oxides. The first metal oxide 203 is deposited over the first dielectric 201 at a thickness of 50 to 150 nanometers (nm). A lithography process for a single electrode patterning is performed. A photoresist 205 is applied and patterned over the first metal oxide layer 203 and an etching step is performed to etch down 60 to 100 nm of the first metal oxide 203 for a first metal tip electrode, as shown in FIG. 2B. The photoresist 205 is stripped. A wet etching step can be used to remove the first metal oxide layer 203.

In FIG. 2C, a deposition process is performed of deposit a metal or metal compound 207 over the etched region of the metal oxide layer 203. A sputter deposition process can be used to deposit the metal or metal compound 207 for a first metal tip electrode. The metal or metal compound 207 is deposited to a thickness of 60 to 100 nm. The metal or metal compound 207 can be selected from Ti, TiN, Ta, TaN, Al, Cu, AlCuSi, and other metals or metal compounds used in CMOS processing. A CMP process is performed over the deposited metal or metal compound 207 to remove excess metal or metal compound 207.

In FIG. 2C, a second photoresist 209 is applied and patterned over the metal or metal compound 207 and an etching step is performed to etch down 60 to 100 nm of the first metal oxide 203 for a second metal tip electrode, followed by stripping of the photoresist 209. A wet etching step can be used to remove the first metal oxide layer 203.

In FIG. 2D, a deposition process is performed of deposit a metal or metal compound 211 over the etched region of the metal oxide layer 203. A sputter deposition process can be used to deposit the metal or metal compound 211 for a second metal tip electrode. The metal or metal compound 211 is deposited to a thickness of 60 to 100 nm. The metal or metal compound 211 can be selected from Ti, TiN, Ta, TaN, Al, Cu, AlCuSi, and other metals or metal compounds used in CMOS processing. A CMP process is performed over the deposited metal or metal compound 211 to remove excess metal or metal compound 211. In this example, the metal or metal compound 207 is different from the metal or metal compound 211.

In FIG. 2E, a deposition of a second metal oxide layer 213 is performed. An ALD process can be used to deposit the second metal oxide 213 to a thickness of 10 to 30 nm. The second metal oxide 213 can include $HfO_2$, $TiO_2$, $Al_2O_3$, $Ta_2O_5$, and other transition metal oxides. In FIG. 2F, a second dielectric layer 215 is deposited over the second metal oxide layer 213. In FIG. 2F, a cross-sectional view of the planar RRAM cell with asymmetric metal tip electrodes 207a and 211a is shown. The metal tip electrodes 207a and 211a in this example are formed of the different metals or metal compounds and therefore are asymmetric. A portion of the metal oxide 217a is formed between the metal tip electrodes 207a and 211a.

FIG. 3A schematically illustrates, in three-dimensional top view, symmetric electrodes, in accordance with the process flow of FIGS. 1A-1E. The metal tip electrodes 107a in this example are formed of the same metal or metal compound 107 and therefore are symmetric. A portion of the metal oxide 109a is formed between the metal tip electrodes 107a. The metal-insulator-metal (MIM) RRAM structure is designed in a planar manner. The two tip electrodes 107a are patterned by lithography process and separated by narrow dielectric switching layer 109a. The shape of the electrode is "V"-like from top view.

The two tip electrodes provide better filament confinement as compared to single tip electrode, which results in better endurance. Both metal tip electrodes 107a are embedded in the metal oxide to avoid filament formation at the metal oxide-dielectric interface, which leads to better control of filament. Furthermore, the filament diameter is almost the same as the electrode thickness, which gives rise to better retention.

FIG. 3B schematically illustrates, in three-dimensional top view, asymmetric electrodes, in accordance with the process flow of FIGS. 2A-2F. The metal tip electrodes 207a and 211a in this example are formed of the different metals or metal compounds and therefore are asymmetric. A portion of the metal oxide 217a is formed between the metal tip electrodes 207a and 211a. The metal-insulator-metal (MIM) RRAM structure is designed in a planar manner. The two tip electrodes 207a and 211a are patterned by lithography process and separated by narrow dielectric switching layer 217. The shape of the metal tip electrodes are "V"-like from top view.

FIGS. 3C-3E, schematically illustrate, in top view, the different fabricated planar tip electrodes 107a, 107b and 107c that can result due to process variations. Device performance begins to degrade if the sharp tip points highlighted in circle 301 of FIG. 3C, deform into rounded tips, as highlighted in circle 301 of FIG. 3D, and the device performance becomes even more degraded if the rounded tips deform into flat tips, as highlighted in circle 301 of FIG. 3E.

Figure 3H:
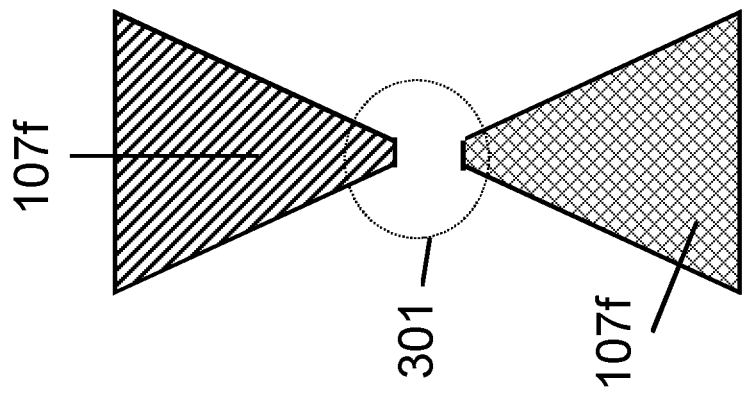
FIGS. 3F-3H schematically illustrate, in top view, asymmetric electrodes having different shaped tips, in accordance with exemplary embodiments.
Figure 3G:
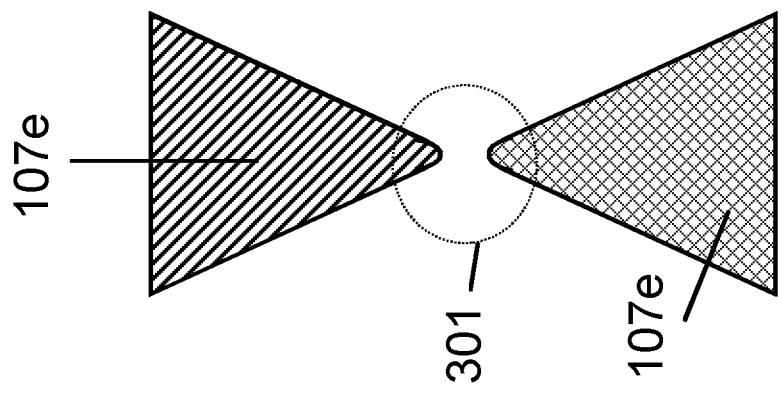
Figure 3F:
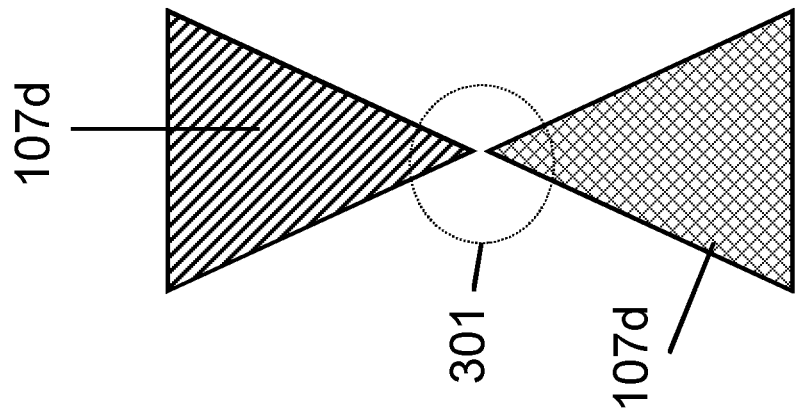

FIGS. 3F-3H, schematically illustrate, in top view, the different fabricated vertical tip electrodes 107d, 107e and 107f that can result due to process variations. Asymmetric vertical tip electrodes are shown, but symmetric vertical tip electrodes can be fabricated as well. Device performance begins to degrade if the sharp tip points highlighted in circle 301 of FIG. 3F, deform into rounded tips, as highlighted in circle 301 of FIG. 3G, and the device performance becomes even more degraded if the rounded tips deform into flat tips, as highlighted in circle 301 of FIG. 3H.

FIGS. 4A-4J schematically illustrate, in cross-sectional view, a process flow to produce a vertical RRAM with self-aligned tip electrodes, in accordance with another exemplary embodiment.

In FIG. 4A a deposition process is performed to deposit a metal or metal compound 403 over a first dielectric layer 401. The first dielectric layer 401 is formed over a substrate (not shown for illustrative convenience). The first dielectric layer 401 can include $SiO_2$, SiCOH, SiN, and other known dielectrics used in CMOS processing. The thickness of the first dielectric layer 401 can be from 80 to 120 nm. The metal or metal compound 403 can include Ti, TiN, Ta, or TaN and formed to a thickness of from 80 to 120 nm.

FIG. 4B, a lithography process for bottom electrode patterning is performed. The metal or metal compound 403 is patterned and the shape of the patterned metal or metal compound 403 is an inverted V-shaped for a bottom metal tip electrode. A reactive ion etching (RIE) can be used to etch the metal or metal compound 403.

In FIG. 4C, a metal oxide layer 405 is deposited over the dielectric layer 401 and metal or metal compound 403. The metal oxide 405 can be deposited by way of ALD to a thickness of 10 to 30 nm. The metal oxide 405 can include $HfO_2$, $TiO_2$, $Al_2O_3$, $Ta_2O_5$, and other transition metal oxides. A second dielectric layer 407 is deposited over the metal oxide 405. The second dielectric layer 407 can include $SiO_2$, SiCOH, or SiN. The thickness of the second dielectric layer 407 can be from 80 to 120 nm. In FIG. 4E, a nitride layer 409 is deposited over the second dielectric layer 407 to a thickness of 80 to 120 nm. The nitride layer 409 can include $Si_3N_4$ and can be deposited by way of CVD.

In FIG. 4F, a polishing step is performed to remove upper portions of the second dielectric layer 407 and the nitride layer 409. The polishing step can be performed by way of CMP. An etch window 407a of the second dielectric layer 407 is formed as a result of the polishing step. In FIG. 4G, a V-shape groove 411 is formed in the second dielectric layer 407. The V-shape groove 411 can be formed by RIE.

In FIG. 4H, a deposition of a second metal or metal compound 413 is deposited over the nitride layer 409 and in the V-shape groove 411. The metal or metal compound 413 can be deposited by sputter deposition and formed of Ti, TiN, Ta, or TaN. The metal or metal compound 413 can be the same or different from that of metal or metal compound 403. The top portions of metal or metal compound 413 can be removed by way of CMP, as shown in FIG. 4I. In FIG. 4J, an etch step, such as RIE removes the remaining excess metal and metal compound 413 for formation of a top metal tip electrode 413a. FIG. 4J illustrates the bottom metal tip electrode 403a and top metal tip electrode separated by a portion of the metal oxide 405.

FIG. 5A schematically illustrates, in three-dimensional top view, vertical RRAM self-aligned tip electrodes 413a and 403a, formed by the process of FIGS. 4A-4J. It is noted that the self-aligned tip electrodes 413a and 403a can be of the same metal or metal compound or different. FIG. 5B schematically illustrates, in cross-sectional view, vertical RRAM self-aligned tip electrodes 413a and 403a, formed by the process of FIGS. 4A-4J. The metal-insulator-metal (MIM) RRAM structure is designed in a vertical manner. In FIG. 5B, the self-aligned tip electrodes 413a and 403a are not the same metal or metal compound. The two self-aligned tip electrodes are patterned by RIE process and separated by a thin switching layer (i.e., metal oxide 405). The two tip electrodes provide better filament confinement as compared to single tip electrode, which results in better endurance. The filament diameter can be tuned by mask design, which gives rise to better retention.

Figure 6A:
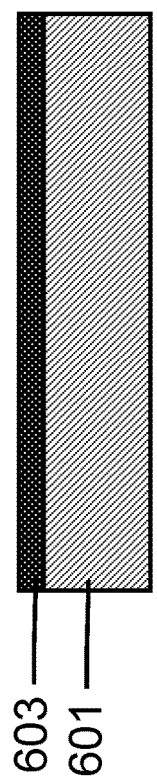
FIGS. 6A-6E schematically illustrate, in cross-sectional view, an etchless process flow to produce a planar RRAM with symmetric tip electrodes, in accordance with an exemplary embodiment.
Figure 6B:
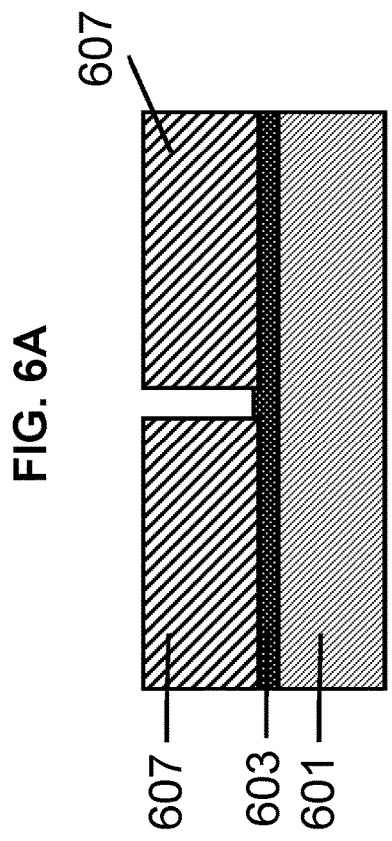

FIGS. 6A-6E schematically illustrate, in cross-sectional view, an etchless process flow to produce a planar RRAM with symmetric tip electrodes, in accordance with an exemplary embodiment. FIG. 6A, a first dielectric layer 601 is formed over a substrate (not shown for illustrative convenience). The first dielectric layer 601 can comprise $SiO_2$, SiCOH, SiN, and other known dielectrics used in complimentary metal oxide semiconductor (CMOS) processing. The thickness of the first dielectric layer 601 can be from 80 to 120 nm. A first metal oxide 603 is deposited on the first dielectric layer 601 by a deposition process such as atomic layer deposition (ALD). The first metal oxide 603 can include $HfO_2$, $TiO_2$, $Al_2O_3$, $Ta_2O_5$, and other transition metal oxides. The first metal oxide 603 is deposited over the first dielectric at a thickness of 10 to 40 nanometers (nm). A lithography process for a two electrode patterning is performed. In FIG. 6B, a deposition process is performed of deposit a metal or metal compound 607 over the etched metal oxide layer 603. A sputter deposition process can be used to deposit the metal or metal compound 607. The metal or metal compound 607 is deposited to a thickness of 60 to 100 nm. The metal or metal compound 607 can be selected from Ti, TiN, Ta, TaN, Al, Cu, AlCuSi, and other metals or metal compounds used in CMOS processing. A lift-off process, which is an additive process (as opposed to a subtractive process such as etching) is performed to create the two electrodes. A lift-off consists of forming an inverse image of the pattern desired on the wafer using a stencil layer. The metal or metal compound layer 607 to be patterned is then deposited over the stenciled wafer. In the exposed areas of the stencil, the metal or metal compound layer material is deposited directly on the metal oxide 603, while in the covered areas, the metal or metal compound material 607 is deposited on top of the stencil film. After the metal or metal compound layer 607 layer has been deposited, the wafer is immersed in a liquid that can dissolve the stencil layer. Once the stencil is dissolved by the liquid, the metal or metal compound layer 607 over it gets lifted off, leaving behind the metal or metal compound layer 607 that was deposited over the metal oxide 603, which forms the final two electrode pattern on the wafer, as illustrated in FIG. 6B.

Figure 6C:
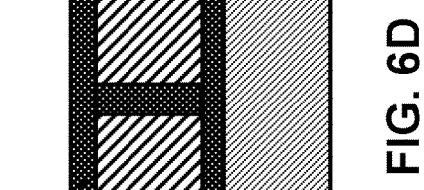
Figure 6D:
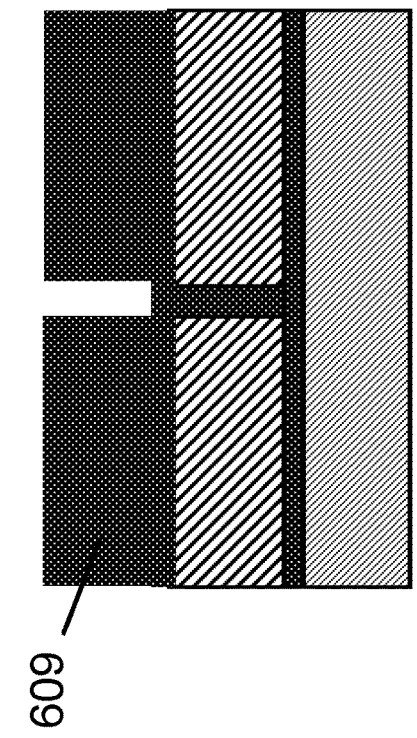
Figure 6E:
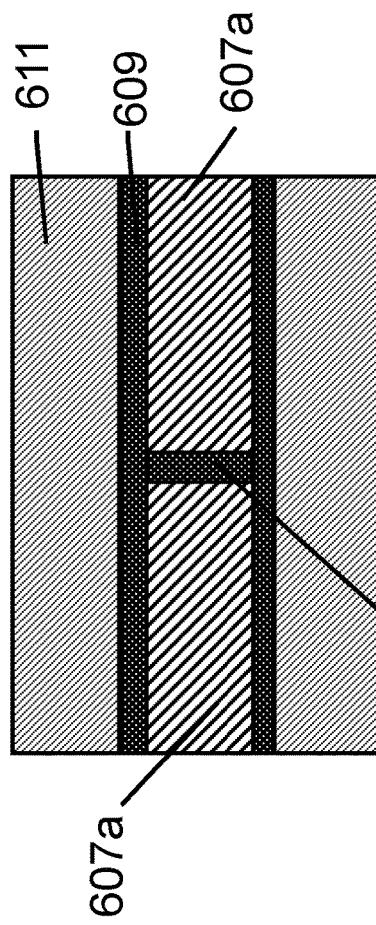

In FIG. 6C, a deposition of a second metal oxide layer 609 is performed. An ALD process can be used to deposit the second metal oxide 609 to a thickness of 80 to 120 nm. The second metal oxide 609 can include $HfO_2$, $TiO_2$, $Al_2O_3$, $Ta_2O_5$, and other transition metal oxides. A CMP step is performed to remove excess second metal oxide 609, as shown in FIG. 6D. In FIG. 6E, a second dielectric layer 611 is deposited over the second metal oxide layer 609. In FIG. 6E, a cross-sectional view of the planar RRAM cell with symmetric metal tip electrodes 607a is shown. The metal tip electrodes 607a in this example are formed of the same metal or metal compound 607 and therefore are symmetric. A portion of the metal oxide 609a is formed between the metal tip electrodes 607a.

FIGS. 7A-7E schematically illustrate, in cross-sectional view, an etchless process flow to produce a planar RRAM with asymmetric tip electrodes, in accordance with an exemplary embodiment. FIG. 7A, a first dielectric layer 701 is formed over a substrate (not shown for illustrative convenience). The first dielectric layer 701 can comprise $SiO_2$, SiCOH, SiN, and other known dielectrics used in complimentary metal oxide semiconductor (CMOS) processing. The thickness of the first dielectric layer 701 can be from 80 to 120 nm. A first metal oxide 703 is deposited on the first dielectric layer 701 by a deposition process such as atomic layer deposition (ALD). The first metal oxide 703 can include $HfO_2$, $TiO_2$, $Al_2O_3$, $Ta_2O_5$, and other transition metal oxides. The first metal oxide 703 is deposited over the first dielectric at a thickness of 10 to 40 nanometers (nm).

A lithography process for a single electrode patterning is performed. In FIG. 7B, a deposition process is performed of deposit a first metal or metal compound 707 over the etched metal oxide layer 703. A sputter deposition process can be used to deposit the metal or metal compound 707. The metal or metal compound 707 is deposited to a thickness of 60 to 100 nm. The metal or metal compound 707 can be selected from Ti, TiN, Ta, TaN, Al, Cu, AlCuSi, and other metals or metal compounds used in CMOS processing. A lift-off process, which is an additive process (as opposed to a subtractive process such as etching) is performed to create the single electrode from metal or metal compound 707. The same lithography, sputtering and lift-off for the second metal or metal compound 708 is then performed, and the resulting pattern shown in FIG. 7B is achieved.

In FIG. 7C, a deposition of a second metal oxide layer 709 is performed. An ALD process can be used to deposit the second metal oxide 709 to a thickness of 80 to 120 nm. The second metal oxide 709 can include $HfO_2$, $TiO_2$, $Al_2O_3$, $Ta_2O_5$, and other transition metal oxides. A CMP step is performed to remove excess second metal oxide 709, as shown in FIG. 7D. In FIG. 7E, a second dielectric layer 711 is deposited over the second metal oxide layer 709. In FIG. 7E, a cross-sectional view of the planar RRAM cell with asymmetric metal tip electrodes 707a and 708a is shown. The metal tip electrodes 707a and 708a are not formed of the same metal or metal compound and therefore are asymmetric. A portion of the metal oxide 709a is formed between the metal tip electrodes 707a and 708a.

Figure 8:
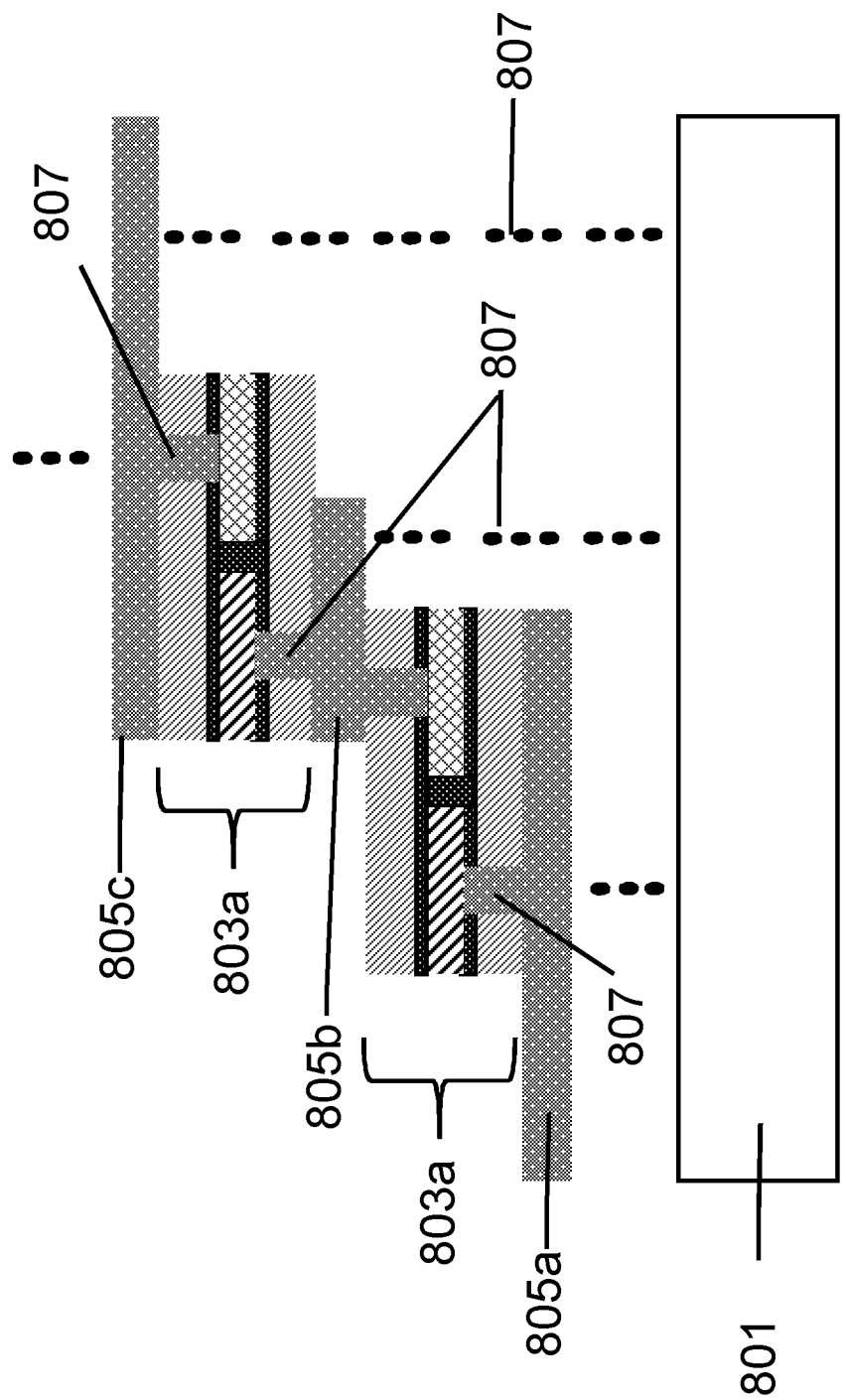
FIG. 8 schematically illustrates, in cross-sectional view, stacked planar RRAM cells, in accordance with exemplary embodiments.

FIG. 8 schematically illustrates, in cross-sectional view, stacked planar RRAM cells, in accordance with an exemplary embodiment. The fabrication of the planar RRAM cell is fully compatible with back end of line (BEOL) processing. Furthermore, the planar RRAM cells 803a and 803b can be stacked in vertical direction over a logic circuit 801 to increase the memory cell density, as illustrated in FIG. 8. The RRAM cells 803a are separated by metal layers 805a ($M_x$), 805b ($M_{x+1}$) and 805c ($M_{x+2}$). Metal filled vias 807 are formed to connect the RRAM cells 803a and 803b with adjacent metal layers 803a, 805b and 805c.

Figure 9:
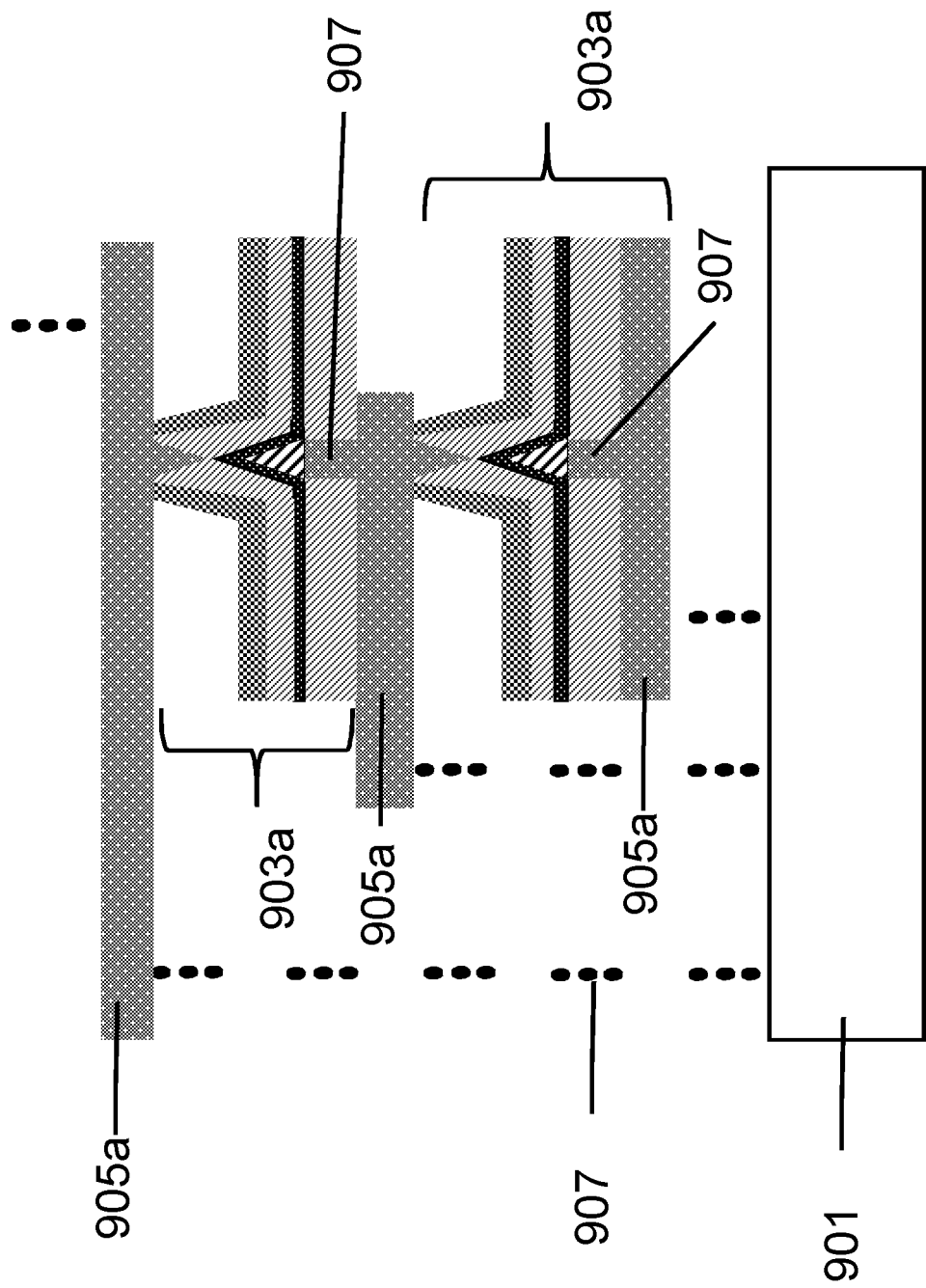
FIG. 9 schematically illustrates, in cross-sectional view, stacked vertical RRAM cells, in accordance with exemplary embodiments.

FIG. 9 schematically illustrates, in cross-sectional view, stacked vertical RRAM cells, in accordance with an exemplary embodiment. The fabrication of the vertical RRAM cell is fully compatible with BEOL processing. Furthermore, the vertical RRAM cells 903a and 903b can be stacked in vertical direction over a logic circuit 901 to increase the memory cell density, as illustrated in FIG. 9. The RRAM cells 903a are separated by metal layers 905a ($M_x$), 905b ($M_{x+1}$) and 905c ($M_{x+2}$). Metal filled vias 907 are formed to connect the RRAM cells 903a and 903b with adjacent metal layers 903a, 905b and 905c.

The embodiments of the present disclosure can achieve several technical effects including enabling the formation of metal-insulator-metal (MIM) RRAM structure that is designed in a vertical manner which offers better control of multi-level resistance states due to good control of filament. An electric field is enhanced at the tip regions and offers better control of the formation and rupture of the filament. This vertical design becomes easier to locate and observe the filament by transmission electron microscopy (TEM). Low power consumption is achieved due to low program voltage, and good retention is achieved due to larger filament size.

The embodiments of the present disclosure can achieve several technical effects including enabling the formation of metal-insulator-metal (MIM) RRAM structure that is designed in a planar manner which provides better endurance due to double tip electrodes. There is better control of multi-level resistance states due to better control of the filament. An electric field is enhanced at the tip regions and offers better control of the formation and rupture of the filament. This double tip planar design becomes easier to locate and observe the filament by transmission electron microscopy (TEM). Good retention is achieved due to larger filament size The embodiments of the present disclosure are suitable for metal oxide based RRAM device fabrication. This type of non-volatile memory can be used in the automotive, aerospace and medical markets which have higher requirements on reliability as compared to memory density. Embodiments of the present disclosure can also enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of RRAM devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure can use various other combinations and embodiments and is capable of any changes or modifications within the scope of the inventive concept as expressed herein.

What is claimed is:

1. A method comprising:
forming a first metal oxide layer on a first dielectric layer;
forming and patterning a mask layer over the first metal oxide layer;
etching the first metal oxide through the mask layer to form openings for a first and second metal electrodes;
removing the mask layer;
forming the first and second metal electrodes in the openings; and
forming a second metal oxide layer over the first and second metal electrodes,
wherein the first and second metal electrodes are v-shaped in top view with tips of the first and second metal electrodes facing each other and a portion of the second metal oxide layer being formed between the tips of the first and second electrodes.

2. The method according to claim 1, further comprising:
forming a second dielectric layer over the second metal oxide layer by chemical vapor deposition (CVD).

3. The method according to claim 2, wherein the first and second dielectric layers comprise silicon dioxide ($SiO_2$), carbon-doped silicon oxide (SiCOH), or silicon nitride (SiN).

4. The method according to claim 1, wherein the first and second metal electrodes form a RRAM cell.

5. The method according to claim 4, further comprising a plurality of RRAM cells stacked over a logic circuit.

6. The method according to claim 4, wherein the first and second metal oxide layers comprise hafnium oxide ($HfO_2$), titanium oxide ($TiO_2$), aluminum oxide ($Al_2O_3$), or tantalum pentoxide ($Ta_2O_5$).

7. The method according to claim 1, further comprising:
forming the first and second metal electrodes by sputter deposition.

8. The method according to claim 7, wherein the first and second metal electrodes comprise titanium (Ti), titanium nitride (TiN), tantalum (Ta), tantalum nitride (TaN), aluminum (Al), copper (Cu), or aluminum copper silicon (AlCuSi).

9. The method according to claim 8, wherein the first and second metal electrodes are symmetric.

10. The method according to claim 8, wherein the first and second metal electrodes are asymmetric.

11. The method according to claim 7, further comprising:
planarizing the first and second metal electrodes by chemical mechanical polishing (CMP) prior to forming the second metal oxide layer.

12. The method according to claim 1, further comprising:
wet or dry etching the first metal oxide through the mask layer to form the openings for the first and second metal electrodes.

13. A method comprising:
forming a first metal oxide layer on a first dielectric layer;
forming and patterning a first mask layer over the first metal oxide layer;
etching the first metal oxide through the first mask layer to form a first opening for a first metal electrode;
forming the first metal electrode in the first opening;
forming and patterning a second mask layer over the first metal oxide layer;
etching the first metal oxide through the second mask layer to form a second opening for a second metal electrode;
forming the second metal electrode in the second opening; and
forming a second metal oxide layer over the first and second metal electrodes,
wherein the first and second metal electrodes comprise different metals and are v-shaped in top view, with tips of the first and second metal electrodes facing each other and a portion of the second metal oxide layer being formed between the tips of the first and second electrodes.

14. The method according to claim 13, wherein the first metal electrode comprise titanium (Ti) or titanium nitride (TiN), the second metal electrode comprises tantalum (Ta) or tantalum nitride (TaN), and the first and second metal electrodes are coplanar.

15. The method according to claim 13, wherein the first and second metal oxide layers comprise hafnium oxide ($HfO_2$), titanium oxide ($TiO_2$), aluminum oxide ($Al_2O_3$), or tantalum pentoxide ($Ta_2O_5$).

16. A method comprising:
forming a first metal layer on a first dielectric layer;
etching the first metal layer to form a first metal electrode having a v-shape in cross-sectional view;
forming a metal oxide layer over the dielectric layer and first metal electrode;
forming a second dielectric layer over the metal oxide layer;
forming and patterning a nitride layer over the second dielectric layer to expose an upper portion of the second dielectric layer;
forming a v-shaped groove in the second dielectric layer; and
forming a second metal electrode in the v-shaped groove,
wherein tips of the v-shaped first and second metal electrodes face each other in cross-sectional view, and a portion of the metal oxide layer is formed between the tips of the first and second electrodes.

17. The method according to claim 16, further comprising:
forming the first and second metal electrodes by sputter deposition, wherein the first and second metal electrodes are vertically stacked,
wherein the first and second metal electrodes comprise titanium (Ti), titanium nitride (TiN), tantalum (Ta), tantalum nitride (TaN), aluminum (Al), copper (Cu), or aluminum copper silicon (AlCuSi),
wherein the tips of the first and second v-shaped electrodes are self-aligned.

18. The method according to claim 16, wherein the first and second metal electrodes form a RRAM cell, and a plurality of RRAM cells are stacked over a logic circuit.

19. A method comprising:
forming a first metal oxide over a dielectric;
performing lithography for electrode patterning;

depositing a metal or metal compound over the first metal oxide;

performing a lift-off process to produce metal v-shaped planar tip electrodes;

forming a second metal oxide over the metal v-shaped planar tip electrodes; and forming a dielectric layer over the second metal oxide.

20. The method according to claim 19, wherein the metal v-shaped planar tip electrodes are symmetric in terms of the metal or metal compound used in forming the metal v-shaped planar tip electrodes.

* * * * *